(12) United States Patent
Hofmann et al.

(10) Patent No.: US 6,599,797 B1
(45) Date of Patent: Jul. 29, 2003

(54) SOI DRAM WITHOUT FLOATING BODY EFFECT

(75) Inventors: Franz Hofmann, Munich (DE); Josef Willer, Riemerling (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/980,811

(22) PCT Filed: May 29, 2000

(86) PCT No.: PCT/DE00/01733

§ 371 (c)(1),
(2), (4) Date: Mar. 11, 2002

(87) PCT Pub. No.: WO01/01490

PCT Pub. Date: Jan. 4, 2001

(30) Foreign Application Priority Data

Jun. 25, 1999 (DE) .......................... 199 29 210

(51) Int. Cl.[7] ...................... H01L 21/8242; H01L 21/20
(52) U.S. Cl. ...................... 438/248; 438/391
(58) Field of Search ................ 438/243, 248, 438/386, 391

(56) References Cited

U.S. PATENT DOCUMENTS

| | | | | |
|---|---|---|---|---|
| 5,155,059 A | * | 10/1992 | Hieda | 438/155 |
| 5,811,283 A | * | 9/1998 | Sun | 438/155 |
| 5,945,703 A | * | 8/1999 | Furukawa et al. | 257/301 |

FOREIGN PATENT DOCUMENTS

| | | | |
|---|---|---|---|
| EP | 682372 | 11/1995 | |
| JP | 06125055 A | * 5/1994 | ......... H01L/27/108 |
| JP | 07161936 | 6/1995 | |
| JP | 08070103 | 3/1996 | |
| JP | 08204146 | 8/1996 | |
| JP | 09260602 | 10/1997 | |

* cited by examiner

Primary Examiner—Eddie Lee
Assistant Examiner—Paul E Brock, II
(74) Attorney, Agent, or Firm—Welsh & Katz, Ltd.

(57) ABSTRACT

The invention relates to an SOI substrate which is provided with a recess that cuts through the silicon layer and the $SiO_2$ layer (O). An upper part of said recess (V) which is located in the range of the silicon layer (S) has cylindrical shape with a horizontal first cross-section. A lower part of the recess (V) which is located in the range of the $SiO_2$ layer (O), compared with the upper part of the recess (V), is bulged to such an extent that it has a cylindrical shape with a horizontal second cross-section that is larger than the first cross-section. A cylinder (Z) of an insulating material is provided in the recess (V). The horizontal cross-section of said cylinder corresponds to the first cross-section and the lower part thereof is located in the lower part of the recess (V). The dent laterally surrounds the lower part of the cylinder (Z). A conducting structure (L) is located in the dent and adjoins the silicon layer (S) and the silicon substrate (1) so that the channel zone of the MOS transistors is electrically connected to the silicon substrate.

6 Claims, 4 Drawing Sheets

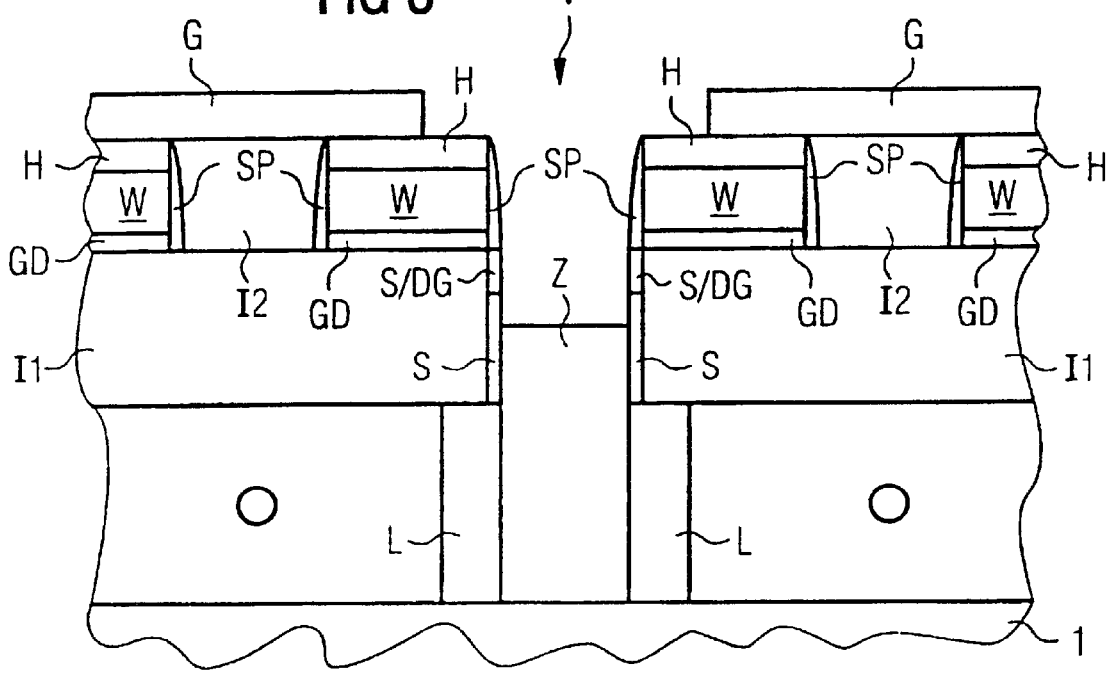
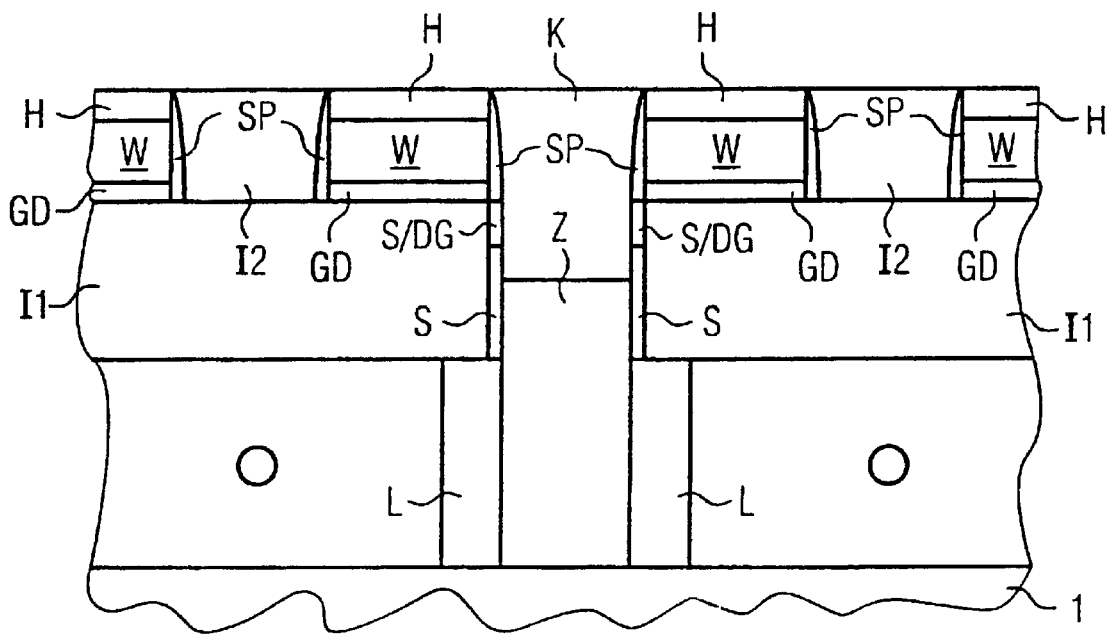

SOI DRAM WITHOUT FLOATING BODY EFFECT

The invention relates to a substrate having a monocrystalline-silicon layer, an $SiO_2$ layer arranged below and a silicon substrate arranged underneath, as well as to a method for its fabrication.

Such a substrate is referred to in the specialist field as an SOI substrate. The use of an SOI substrate instead of a customary silicon substrate for integrated semiconductor components offers a number of advantages. For instance, owing to the small thickness of the monocrystalline-silicon layer, which is customarily between 50 nm and 200 nm, active regions of the semiconductor components may be completely surrounded by insulating structures. To that end, installation trenches produced starting from one surface of the SOI substrate extend as far as the $SiO_2$ layer. The complete insulation of the active regions avoids leakage currents between semiconductor components that neighbor one another. It is also possible to avoid short channel effects in transistors. A further advantage of using an SOI substrate is that capacitances at pn junctions are very small since no space-charge regions can be formed under the pn junctions, so that the switching speeds of the semiconductor components can be increased greatly and the semiconductor components' power consumption can be lowered greatly. If a DRAM cell arrangement is produced in an SOI substrate, then any bit line capacitance can be reduced greatly for the same reason.

However, complete insulation of the active region also leads to negative effects, which are known as floating body effects. These effects are due to the fact that charge carriers created in the active region cannot be dissipated. This is particularly relevant to charge carriers produced in a channel region of a MOS transistor.

An SOI substrate, in which floating body effects are avoided, is described in Cuong T. Nguyen et al. "Quasi-SOI MOSFETs Using Selective Epitaxy and Polishing", IEDM (1992), 341. The $SiO_2$ layer is not continuous, but rather is interrupted by a silicon column. The silicon layer is not continuous either, but rather is embedded in an upper part of the $SiO_2$ layer. The silicon column connects the silicon substrate to the silicon layer. A MOS transistor is arranged in the silicon layer in such a way that a channel region of the MOS transistor is connected to the silicon column. The channel region of the MOS transistor is hence connected to the silicon substrate through the silicon column, so that charge carriers produced in the channel region can be dissipated and floating body effects are avoided. To produce the SOI substrate, the $SiO_2$ layer is produced on the silicon substrate and is patterned with the aid of two masked etching processes. During these, on the one hand, a recess, in which the silicon column will be produced at a later time, is produced as far as the silicon substrate. On the other hand, $SiO_2$ is etched, in the environment of the recess, to a substantially smaller depth than the recess. By selective epitaxy and subsequent chemical-mechanical polishing until a surface of the $SiO_2$ layer is exposed, the silicon column as well as, in the environment of the recess, the silicon layer is produced.

Y. Nishioka et al. "Giga-bit Scale DRAM Cell with New Simple Ru/(Ba,Sr)TiO$_3$/Ru Stacked Capacitors Using X-ray Lithography" IEDM (1995) 903, describes a DRAM cell arrangement in which a memory cell comprises a transistor and a capacitor. The transistor is a planar transistor, and its gate electrode is part of a word line that extends along a surface of a substrate in which the DRAM cell arrangement is arranged. Two transistors of two memory cells respectively share a common source/drain region that is connected to a bit line. The transistor has a further source/drain region, which is connected through a contact to a capacitor. The common source/drain region has a first part and a second part, which are respectively arranged between the word line and a neighboring word line and which adjoin one another. A connecting line drawn through the second part of the common source/drain region, the further source/drain region of the transistor and the further source/drain region of the neighboring transistor, is straight. The bit line is connected to the first part of the common source/drain region. Insulating structures laterally separate from each other source/drain regions of transistors of memory cells that neighbor one another along the word line. The insulating structures furthermore laterally separate from each other the further source/drain regions, which are connected to capacitors of memory cells that neighbor one another along the bit line.

The term "cylinder" denotes a body that is bounded by two parallel planes and a surface that is created by parallel displacement of a straight line along a space curve (cf. e.g. "Meyer's Lexikon"). If the space curve is a circle, then the term "circular cylinder" is used. In particular, a cuboid is also a cylinder. The term "cylinder" will also be used below to denote a body or a shape that deviates slightly from the mathematically rigorous cylinder. The deviation may be due e.g. to irregularities during etching processes, to deposition methods in which recesses are not completely filled in the vicinity of edges, or to the provision of auxiliary structures that are advantageous for a fabrication method and may e.g. narrow a part of the cylinder.

It is an object of the invention to provide a further SOI substrate in which the monocrystalline-silicon layer is connected to the silicon substrate, and which is suitable for an integrated semiconductor component in which floating body effects are avoided. It is also an object to provide a method for fabricating such an SOI substrate.

The object is achieved by an SOI substrate in which a recess is provided that cuts through a silicon layer and an $SiO_2$ layer arranged below. An upper part of the recess, which part is arranged in the vicinity of the silicon layer, has a cylindrical shape with a horizontal first cross section. A lower part of the recess, which part is arranged in the vicinity of the $SiO_2$ layer, is bulged relative to the upper part of the recess such that it has a cylindrical shape with a horizontal second cross section that is larger than the first cross section. A cylinder of insulating material has a horizontal cross section that corresponds to the first cross section. A lower part of the cylinder is arranged in the lower part of the recess. The bulge is configured such that it laterally surrounds the lower part of the cylinder. A conductive structure, which adjoins the silicon layer and a silicon substrate, on which the $SiO_2$ layer is arranged, is arranged in the bulge.

The silicon layer is connected to the silicon substrate through the conductive structure.

The object is furthermore achieved by a method for producing an SOI substrate, in which a recess that cuts through a silicon layer and an $SiO_2$ layer arranged below is produced in the SOI substrate by anisotropic etching. A lower part of the recess, which part is arranged in the vicinity of the $SiO_2$ layer, is widened by isotropic etching of $SiO_2$ selectively with respect to silicon so that it has a bulge relative to an upper part of the recess, which part is arranged in the vicinity of the silicon layer. Subsequently, conductive material is deposited substantially conformally and etched back until a bottom of the recess is exposed, so that a conductive structure, which adjoins the silicon layer and the silicon substrate, is produced in the bulge. Subsequently, insulating material is introduced into the recess so as to produce a cylinder, the lower part of which is arranged in the lower part of the recess and is laterally surrounded by the conductive structure.

The method may be carried out starting with commercially available SOI substrates, in which the conductive structure is subsequently produced. The production of the conductive structure does not require any elaborate process steps, such as selective epitaxy.

Examples of suitable conductive material for the conductive structure include metals, metal silicides or semiconductor material.

The conductive structure preferably consists of doped silicon, the conductivity type of which corresponds to the conductivity type of the silicon substrate and of the silicon layer. In this way, contact resistances between the conductive structure and the silicon substrate, or the silicon layer, are particularly small.

Since the conductive structure adjoins the silicon layer from below, the conductive material of the conductive structure has particularly little influence on a semiconductor component arranged in the silicon layer. This aspect also entails great latitude in the selection of the conductive material for the conductive structure.

The semiconductor component is, for example, a MOS transistor. In this case, the conductive structure connects a channel region of the MOS transistor to the silicon substrate.

Since the silicon layer is preferably between 50 and 200 nm thick, the MOS transistor is generally designed as a planar transistor.

To increase the packing density of an integrated circuit arrangement, to which the MOS transistor belongs, it is advantageous for the recess to cut through a source/drain region of the MOS transistor. In this case, a contact that connects with the source/drain region can additionally be produced in the recess.

To produce such a contact, the cylinder is, for example, first produced by depositing the insulating material and etching it back in such a way that the upper part of the recess is not completely filled. Subsequently, conductive material is deposited in such a way that the contact is produced over the cylinder.

Alternatively, the recess is arranged beside the source/drain region.

The MOS transistor can be part of a memory cell of a DRAM cell arrangement. A capacitor, which is connected to the MOS transistor, is provided as a further part of the memory cell. A gate electrode of the MOS transistor may be part of a word line that extends along the surface of the substrate.

To increase the packing density of the DRAM cell arrangement, i.e. to reduce the area required per memory cell, the source/drain region (referred to below as the "common source/drain region") is at the same time the source/drain region of a further MOS transistor, which belongs to a further memory cell and whose gate electrode is part of a word line that neighbors the word line. A further source/drain region of the MOS transistor is connected to the capacitor. The contact, which adjoins the common source/drain region, is connected to a bit line extending over the substrate.

To increase the packing density, it is advantageous for lateral faces of the word lines to be provided with insulating spacers, and for the contact to adjoin one of the spacers of the word line and one of the spacers of the neighboring word line. This arrangement can be produced by a method having a self-aligned etching step, i.e. a step without masks to be aligned. To that end, the word line is covered with a protective layer. During the production of the recess, silicon is etched selectively with respect to the protective layer and with respect to the spacers, so that the contact, whose lower part is produced in the recess, adjoins the spacer of the word line, the spacer of the neighboring word line and the common source/drain region. During this etching step, it is expedient to use a mask. However, the alignment tolerance of the mask is so great, owing to the protective layer and the spacers, that this may be considered as a self-aligned etching step.

A layout of the DRAM cell arrangement may correspond to the one in Y. Nishioka et al. (ibid.). Hence, it is possible to provide insulating structures which separate from each other the source/drain regions of the MOS transistors of memory cells that neighbor one another along the word line. The insulating structures furthermore separate from each other the further source/drain regions, which are connected to capacitors of memory cells that neighbor one another along the bit line. The common source/drain region has a first part and a second part, which are respectively arranged between the word line and the neighboring word line and which adjoin one another. The contact with the bit line is arranged in the first part of the common source/drain region. A connecting line drawn through the further source/drain region of the MOS transistor, the second part of the common source/drain region and the further source/drain region of the further transistor, is straight. To avoid leakage currents, it is advantageous for the insulating structures to respectively adjoin the surface of the substrate, and the silicon substrate.

The advantageous effects of the invention are independent of the layout of the DRAM cell arrangement.

The $SiO_2$ layer is advantageously between approximately 100 nm and approximately 500 nm thick.

An exemplary embodiment of the invention will be explained in more detail with reference to the figures, in which:

FIG. 3 shows the cross section in FIG. 2, after the recess has been widened, conductive structures have been produced, the protective spacers have been removed and cylinders of insulating material have been produced.

FIG. 4 shows the cross section in FIG. 3, after contacts have been produced and the insulating layer has been removed.

The figures are not true to scale.

In the exemplary embodiment, an SOI substrate is provided which consists of an approximately 150 nm-thick monocrystalline-silicon layer S, an approximately 200 nm-thick $SiO_2$ layer O arranged below and a silicon substrate 1 arranged underneath (cf. FIGS. 1a and 1b).

Insulating structures I1, which laterally surround active regions of the MOS transistors, are produced using steps that are known from the prior art. The insulating structures I1 extend from a surface F of the SOI substrate as far as the $SiO_2$ layer O.

Two of the MOS transistors are produced in each active region that is surrounded by an insulating structure I1. A common source/drain region S/DG of the two MOS transistors is provided at the center of the active region (cf. FIGS. 1a, 1b and 1c). The common source/drain region S/DG is arranged between two word lines W that neighbor one another, which extend essentially parallel to one another and which are separated from the surface F of the SOI substrate by a gate dielectric GD.

The word lines W are approximately 200 nm thick, and contain doped polysilicon and tungsten silicide arranged on top. The word lines W are approximately 150 nm wide. Word lines W that neighbor one another have a spacing of approximately 150 nm.

Figure 1A:
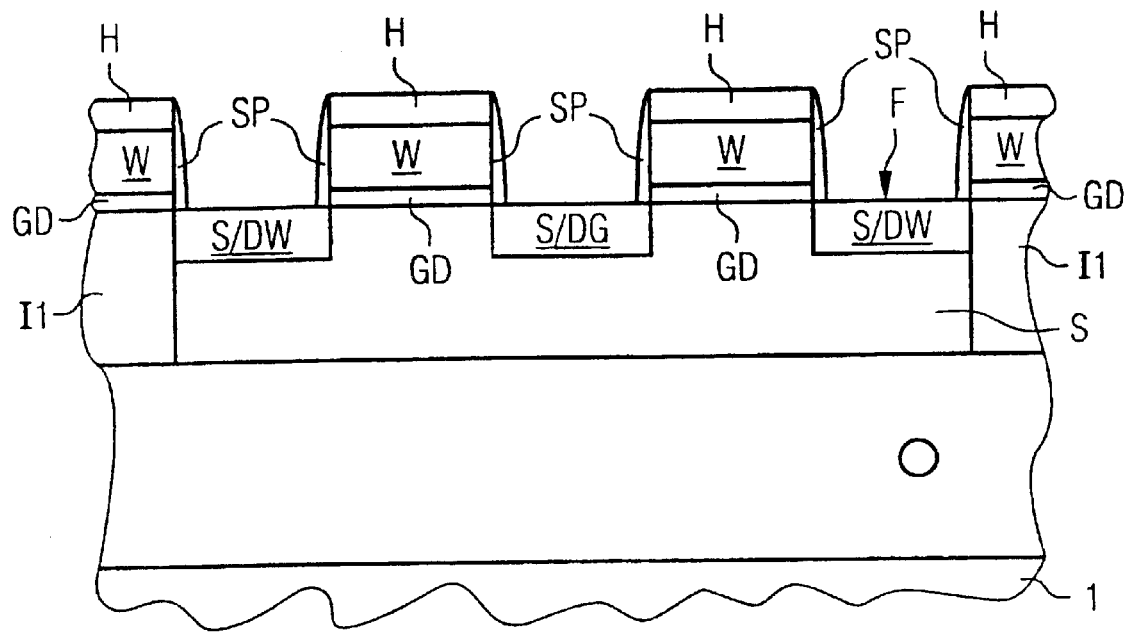
FIG. 1a show a cross section through an SOI substrate, after insulating structures, MOS transistors of memory cells, word lines, spacers and a protective layer have been produced.
Figure 1B:
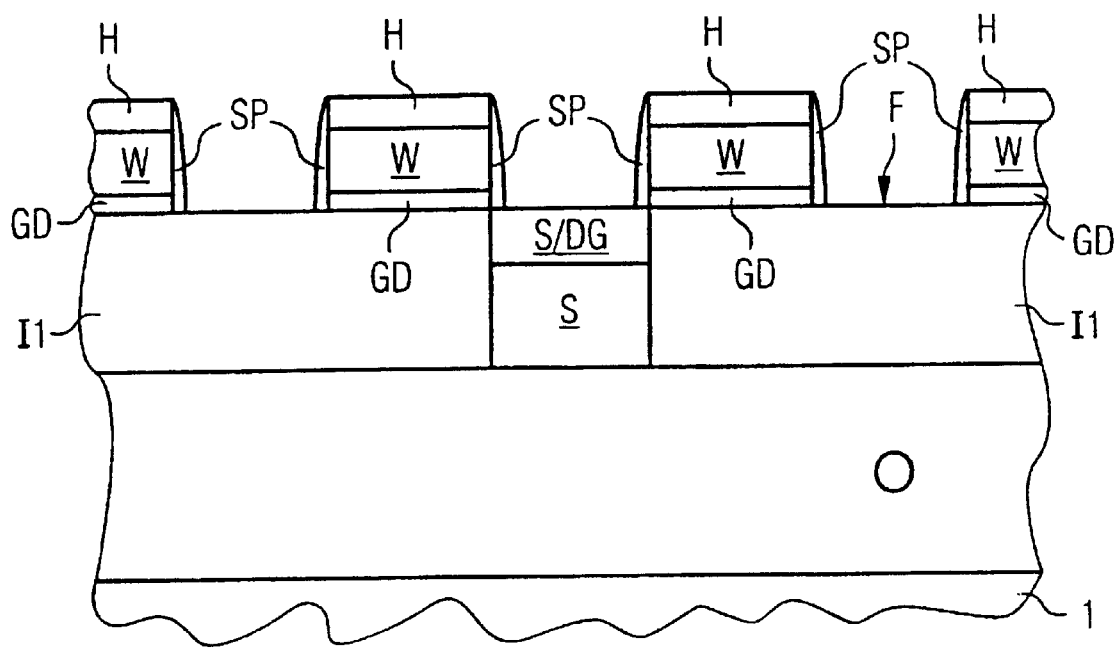
FIG. 1b show a cross section, parallel to the cross section in FIG. 1a, through the SOI substrate.
Figure 1C:
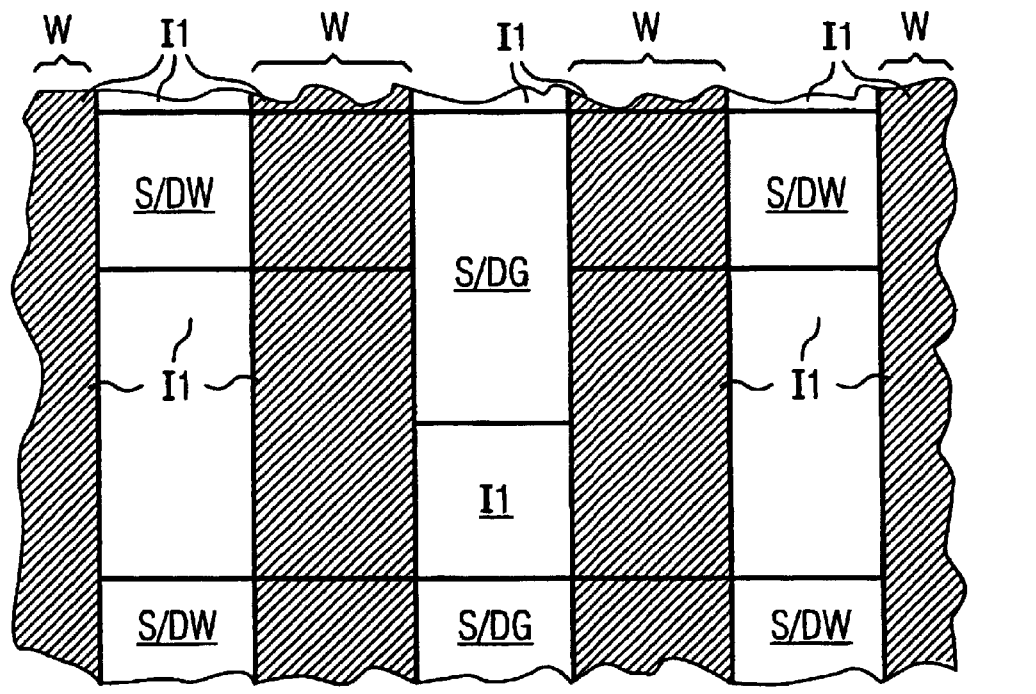
FIG. 1c shows a plan view of the SOI substrate, in which source/drain regions of the MOS transistors, the insulating structures and the word lines are represented.

The two MOS transistors respectively have a further source/drain region S/DG, likewise arranged in the active region (cf. FIGS. 1a and 1c). The common source/drain region S/DG has a first part and a second part, which are respectively arranged between the word lines W and which adjoin one another. A connecting line drawn through the further source/drain region S/DW of the one MOS transistor, the second part of the common source/drain region S/DG and the further source/drain region S/DW of the other MOS transistor, is straight. The first part and the second part of the common source/drain region S/DG are hence arranged next to one another along the word-line direction.

Lateral faces of the word lines W are covered with insulating silicon-nitride spacers SP, which are approximately 20 nm thick (cf. FIGS. 1a and 1b). The word lines W are furthermore covered with an approximately 50 nm-thick protective layer H of silicon nitride (cf. FIGS. 1a and 1b).

Figure 2:
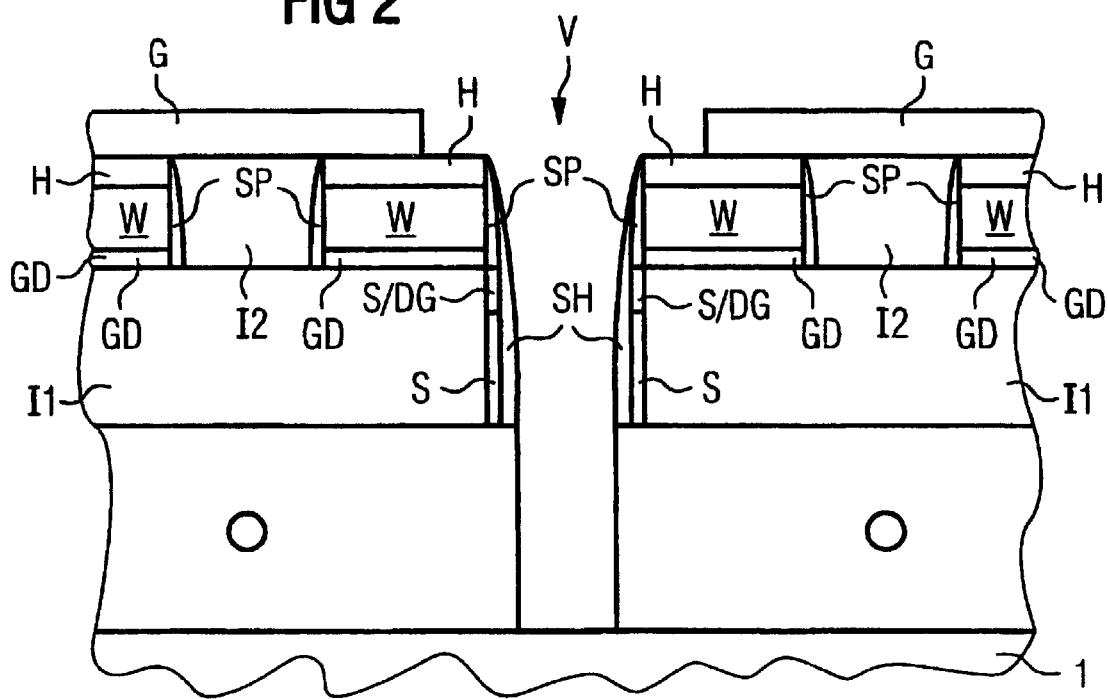
FIG. 2 shows the cross section in FIG. 1b, after further insulating structures, an insulating layer, recesses and protective spacers have been produced.

Further insulating structures I2 are produced between the word lines W by depositing $SiO_2$ with a thickness of approximately 200 nm and planarizing it by chemical-mechanical polishing until the protective layer H is exposed (cf. FIG. 2).

To produce an auxiliary layer G, silicon nitride is deposited with a thickness of approximately 50 nm (cf. FIG. 2).

A photoresist mask is produced, which does not cover rectangular zones with a side length of approximately 150 nm in the word-line direction and a side length of approximately 300 nm perpendicular to the word-line direction. The zones overlap the first parts of the common source/drain region S/DG. With the aid of the photoresist mask, silicon nitride is etched until parts of the further insulating structures I2 are exposed (cf. FIG. 2). Subsequently, $SiO_2$ is etched selectively with respect to silicon nitride using $C_2F_6$, $C_3F_8$, until the exposed parts of the further insulating structures I2 are removed (cf. FIG. 2).

To produce recesses V, silicon is etched selectively with respect to silicon nitride using e.g. HBr, He, $O_2$, $NF_3$, until the $SiO_2$ layer O is exposed. The recesses V cut through the first parts of the common source/drain regions S/DG.

The photoresist mask is removed.

To produce auxiliary spacers SH, silicon nitride is deposited with a thickness of approximately 10 nm, and etched back until silicon nitride is removed at the bottom of the recesses V. The auxiliary spacers SH cover sides of the recesses V (cf. FIG. 2).

Subsequently, the recesses V are deepened further by etching $SiO_2$, using e.g. $C_2F_6$, $C_3F_8$, selectively with respect to silicon nitride until the silicon substrate 1 is exposed (cf. FIG. 2).

Subsequently, the recesses V are widened in the vicinity of the $SiO_2$ layer, by isotropically etching $SiO_2$ selectively with respect to silicon nitride. The recesses V now respectively have an upper part, which is arranged in the vicinity of the silicon layer S and has a cylindrical shape with a horizontal first cross section, and a lower part, which is arranged in the vicinity of the $SiO_2$ layer O and is bulged relative to the upper part such that it has a cylindrical shape with a horizontal second cross section that is larger than the first cross section. The first cross section is rectangular with side lengths of 110 nm and 150 nm. The second cross section is rectangular with side lengths of 210 nm and 250 nm. During the widening of the recesses V, the auxiliary spacers SH protect the further insulating structures I2 and, if applicable, also the insulating structures I1.

The auxiliary spacers SH are removed by isotropic etching using e.g. phosphoric acid.

To produce conductive structures L, which electrically connect the silicon layer S to the silicon substrate 1, in-situ p-doped polysilicon is deposited with a thickness of approximately 50 nm, and etched back until the silicon substrate 1 is exposed (cf. FIG. 3). The conductive structures L are thereby created in the bulges of the recesses V.

Subsequently, $SiO_2$ is deposited with a thickness of approximately 100 nm and etched back to approximately 50 nm below the surface F of the SOI substrate, so that a cylinder Z of insulating material is respectively produced in the recesses V. A horizontal cross section of the cylinder Z corresponds to the first cross section of the recess V (cf. FIG. 3). Owing to the removed auxiliary spacers SH, the cylinder Z does not have a mathematically rigorous cylinder shape. The horizontal cross section of the cylinder Z is slightly larger in the upper part of the recess V.

The conductive structure L laterally surrounds the cylinder Z.

To produce contacts K, n-doped polysilicon is deposited with a thickness of approximately 100 nm, and etched back until the auxiliary layer G is exposed. Subsequently, polysilicon and silicon nitride are eroded by chemical-mechanical polishing until the auxiliary layer G is removed and the auxiliary layer H is exposed (cf. FIG. 4). The contacts K, which extend into the recesses V, connect with the common source/drain regions S/DG and respectively adjoin a spacer SP of a word line W and a spacer SP of a word line W that neighbors the latter, are thereby produced in the recesses V (cf. FIG. 4).

Figure 5:
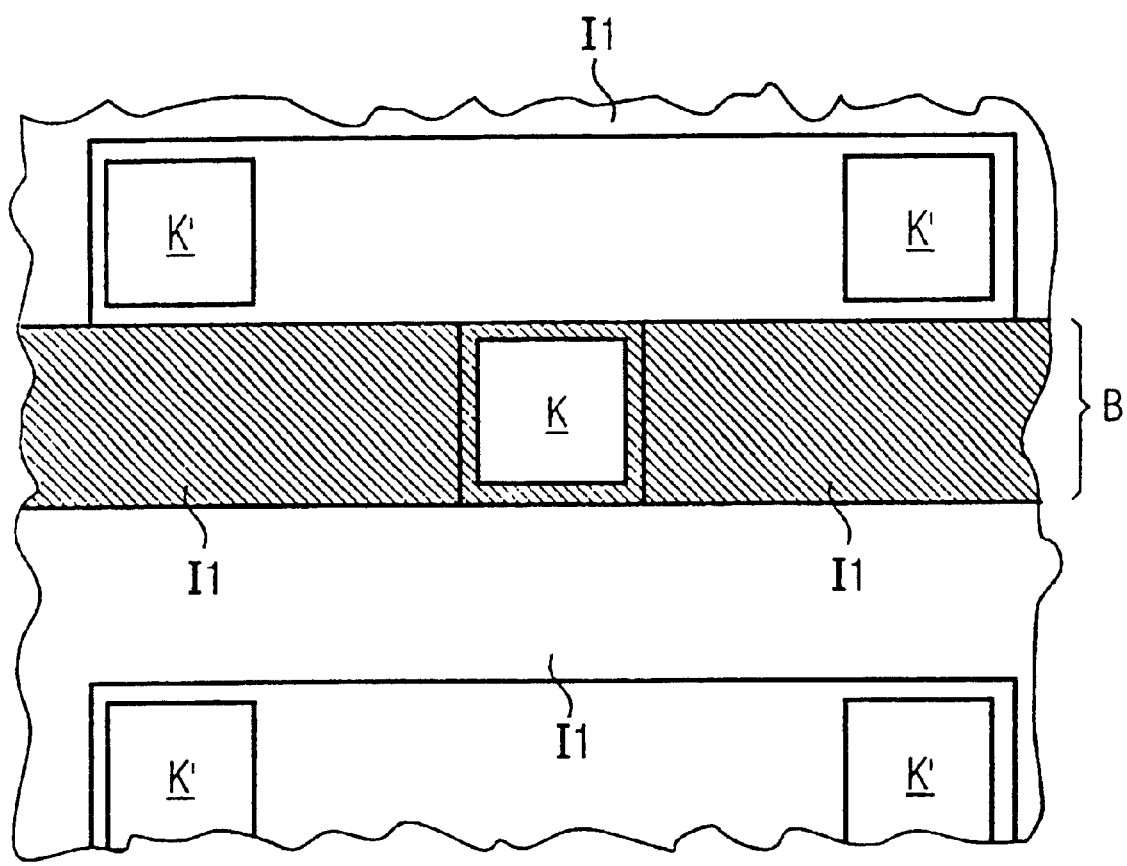
FIG. 5 shows the plan view of the SOI substrate, in which the contacts, contacts with storage capacitors, the source/drain regions and bit lines are represented.

Bit lines B, which adjoin the contacts K and extend transversely with respect to the word lines W (cf. FIG. 5), are produced. Further contacts K', which adjoin the further source/drain regions S/DW and on which storage capacitors (not shown) are produced, are also produced.

A memory cell of the DRAM cell arrangement that is produced respectively comprises one of the MOS transistors and one of the storage capacitors, which are connected to one another.

Many variations of the exemplary embodiment, which likewise lie within the scope of the invention, are conceivable. For instance, dimensions of the layers, regions, structures and lines can be matched to the particular requirements.

What is claimed is:

1. A method for fabricating a substrate, the substrate having a monocrystalline-silicon layer, an $SiO_2$ layer arranged below and a silicon substrate arranged underneath, a recess in the silicon layer and the $SiO_2$ layer exposed by anisotropic etching, the recess having a lower part in the vicinity of the $SiO_2$, said lower part being widened by isotropic etching of $SiO_2$ so that it has a bulge relative to an upper part of the recess conductive material being deposited and etched back until a bottom of the recess is exposed, so that a conductive structure is produced in the bulge which adjoins the monocrystalline silicon layer and the silicon substrate, and insulating material is introduced into the recess so as to produce a cylinder, a lower part being arranged in the lower part of the recess and being laterally surrounded by the conductive structure.

2. The method of claim 1, wherein a MOS transistor is produced in the silicon layer, and the recess and the MOS transistor are produced in such a way that the conductive structure electrically connects a channel region of the MOS transistor to the silicon substrate.

3. The method of claim 2, wherein a first source/drain region of the MOS transistor is produced by implantation in such a way that it adjoins a surface of the substrate, the recess being produced in such a way that it cuts through the first source/drain region, the insulating material being deposited and etched back to produce the cylinder so that the upper part of the recess is not completely filled, and conductive material being deposited in such a way that a contact partially arranged in the recess connecting with the first source drain region, is produced over the cylinder.

4. The method of claim 3, wherein a capacitor that, together with the MOS transistor, forms a memory cell of a DRAM cell, the MOS transistor being produced as a planar transistor, a gate electrode of the MOS transistor being produced as part of a first word line that extends along the surface of the substrate, insulating spacers being produced on lateral faces of the first word line, the first word line being covered with a protective layer, the MOS transistor of the memory cell being produced in such a way that the first source/drain region of the MOS transistor and a second source/drain region of a second MOS transistor, which belongs to a second memory cell and whose gate electrode is part of a second word line adjacent the first word line, form a common source/drain region, the recess being produced by the anisotropic etching, the anisotropic etching being carried out selectively with respect to the protective layer and with respect to the spacers, so that the contact that is produced partly in the recess adjoins one of the spacers of the first word line and one of the spacers of the second word line, whereby a bit line, which extends over the substrate and is connected to the contact, is produced.

5. The method of claim 4, wherein insulating structures are produced, said insulating, structures respectively extending from the surface of the substrate as far as the $SiO_2$ layer, said insulating structures separating the source/drain regions of MOS transistors of memory cells adjacent to one another along the first word line and separating third source/drain regions, the recess being produced in the common source/drain region, and the MOS transistors being produced in such a way that a connecting line drawn through the first source/drain regions of the MOS transistor, the common source/drain region and the second source/drain region of the second MOS transistor, is straight.

6. The method of claim 1, whereby the silicon layer is between approximately 50 nm and approximately 200 nm thick, and the $SiO_2$ layer is between approximately 100 nm and approximately 500 nm thick.

* * * * *